(12) United States Patent
Richter et al.

(10) Patent No.: US 7,638,424 B2
(45) Date of Patent: Dec. 29, 2009

(54) TECHNIQUE FOR NON-DESTRUCTIVE METAL DELAMINATION MONITORING IN SEMICONDUCTOR DEVICES

(75) Inventors: Ralf Richter, Dresden (DE); Carsten Peters, Dresden (DE); Holger Schuehrer, Dresden (DE)

(73) Assignee: GlobalFoundries, Inc., Grand Cayman (KY)

( * ) Notice: Subject to any disclaimer, the term of this patent is extended or adjusted under 35 U.S.C. 154(b) by 314 days.

(21) Appl. No.: 11/536,730

(22) Filed: Sep. 29, 2006

(65) Prior Publication Data
US 2007/0178691 A1    Aug. 2, 2007

(30) Foreign Application Priority Data
Jan. 31, 2006    (DE) .................... 10 2006 004 428

(51) Int. Cl.
*H01L 21/4763*    (2006.01)
*H01L 21/44*    (2006.01)

(52) U.S. Cl. ................ 438/625; 438/623; 438/631; 438/654

(58) Field of Classification Search ................. 438/625, 438/687, 623, 622, 624, 626, 628, 631, 654
See application file for complete search history.

(56) References Cited

U.S. PATENT DOCUMENTS

| 6,313,541 | B1 | 11/2001 | Chan et al. .................. 257/786 |
| 6,501,186 | B1 | 12/2002 | Yu et al. ...................... 257/786 |
| 2005/0142840 | A1* | 6/2005 | Fujimaki .................... 438/622 |
| 2005/0170640 | A1* | 8/2005 | Nakagawa et al. .......... 438/631 |

* cited by examiner

*Primary Examiner*—Chuong A. Luu
(74) *Attorney, Agent, or Firm*—Williams, Morgan & Amerson (57) ABSTRACT

By providing large area metal plates in combination with respective peripheral areas of increased adhesion characteristics, delamination events may be effectively monitored substantially without negatively affecting the overall performance of the semiconductor device during processing and operation. In some illustrative embodiments, dummy vias may be provided at the periphery of a large area metal plate, thereby allowing delamination in the central area while substantially avoiding a complete delamination of the metal plate. Consequently, valuable information with respect to mechanical characteristics of the metallization layer as well as process flow parameters may be efficiently monitored.

19 Claims, 6 Drawing Sheets

TECHNIQUE FOR NON-DESTRUCTIVE METAL DELAMINATION MONITORING IN SEMICONDUCTOR DEVICES

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines providing the inner-level electrical connection, and also include a plurality of inter-level connections, also referred to as vias, filled with an appropriate metal. The vias provide electrical connection between two neighboring stacked metallization layers, wherein the metal-containing lines and vias may also be commonly referred to as interconnect structures.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers may increase and the dimensions of the individual metal lines and vias may be reduced as the number of circuit elements per chip area becomes larger. The fabrication of a plurality of metallization layers entails extremely challenging issues to be solved, such as mechanical, thermal and electrical reliability of a plurality of stacked layers. As the complexity of integrated circuits advances and brings about the necessity for conductive lines that can withstand moderately high current densities, semiconductor manufacturers are increasingly replacing the well-known metallization metal aluminum with a metal that allows higher current densities and hence allows a reduction in the dimensions of the interconnections and thus the number of stacked metallization layers. For example, copper and alloys thereof are materials that are increasingly used to replace aluminum, due to their superior characteristics in view of higher resistance against electromigration and significantly lower electrical resistivity when compared with aluminum.

Despite these advantages, copper and copper alloys also exhibit a number of disadvantages regarding the processing and handling in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called inlaid or damascene technique (single and dual) is therefore preferably used, wherein a dielectric layer is formed first and then patterned to receive trenches and/or vias which are subsequently filled with copper or copper alloys.

It turns out that the process of forming vias and trenches in the dielectric material of the respective metallization layer according to the damascene regime may significantly affect the overall production yield during the formation of advanced semiconductor devices having copper-based metallization layers, owing to delamination issues and etch-related geometry effects.

With reference to FIGS. 1a-1d, a typical conventional process flow will now be described in more detail to more clearly demonstrate the problems involved in forming highly scaled metal lines in a dielectric material according to a damascene process, for instance a dual damascene process, in which vias are formed prior to corresponding trenches connected to the vias, wherein this approach is often called a "via first trench last" approach.

Figure 1A:
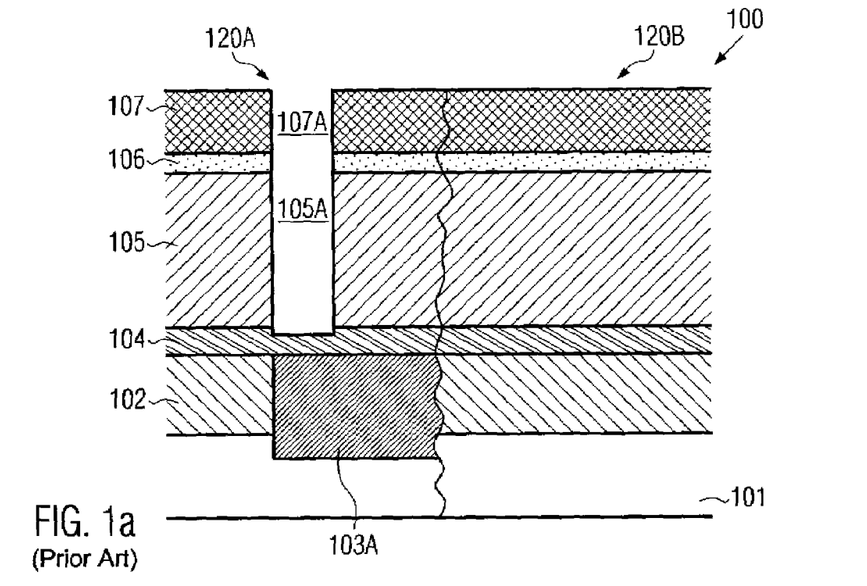
FIGS. 1a-1d schematically show cross-sectional views of a semiconductor device during the formation of a metallization layer including metal lines and a large area metal region for test purposes during various manufacturing stages in accordance with a conventional process technique.

FIG. 1a schematically shows a cross-sectional view of a semiconductor device 100 comprising a substrate 101, which may be provided in the form of a bulk silicon substrate, a silicon-on-insulator (SOI) substrate and the like, wherein the substrate 101 may also represent a device layer having formed therein individual circuit elements, such as transistors, capacitors, lines, resistors, contact portions and the like. For convenience, any such circuit elements are not shown in FIG. 1a. The device 100 comprises a first device region 120A and a second device region 120B, wherein the first device region 120A may represent an "inner" region that receives metal lines and vias, whereas the second device region 120B may represent a device region for receiving a large metal area in the respective metallization layer together with corresponding metal lines in the first device region 120A. For example, a measurement region and the like may be formed in the second device region 120B, as is typically provided for evaluating so-called dishing effects occurring during the removal of excess copper by chemical mechanical polishing (CMP).

The device 100 further comprises a dielectric layer 102 formed above the substrate 101, wherein the layer 102 may represent a dielectric material enclosing the individual circuit elements, also referred to as a contact material, or the layer 102 may represent a portion of a lower-lying metallization layer, in which any metal-filled lines may be embedded. Depending on the specific design of the device 100, or the function of the layer 102, it may be comprised of a conventional dielectric material such as silicon dioxide or silicon nitride, or it may comprise a low-k dielectric material such as, for instance, hydrogen-enriched silicon oxycarbide (SiCOH) and the like. A metal line 103A is formed within the first device region 120A and above the substrate 101 and at least partially within the layer 102 for establishing an electric connection to circuit elements formed within the first device region 120A. The metal line 103A may be comprised of a copper-containing metal including conductive barrier layers (not shown) to enhance adhesion of the metal line 103A to the surrounding material and reduce diffusion of copper into sensitive device regions. An etch stop layer 104 is formed on the dielectric layer 102 and the metal line 103A, wherein the etch stop layer 104 may be comprised of a material that exhibits a high etch selectivity to the material of a dielectric layer 105 formed on the etch stop layer 104. Furthermore, the etch stop layer 104 may also act as a diffusion barrier between the metal line 103A and neighboring materials to reduce the diffusion of metal, such as copper, and diffusion of dielectric material into the metal line 103A.

The dielectric layer 105, which may be comprised of a low-k dielectric material, is formed on the etch stop layer 104, followed by an anti-reflective coating (ARC) layer or capping layer 106, which may be formed from two or more sub-layers to achieve the desired performance with respect to the optical behavior, mechanical strength and masking characteristics. For instance, the capping layer 106 may be provided as a stack including a silicon dioxide layer (acting to impart improved mechanical strength to the layer 105 when formed of a low-k material) and a silicon oxynitride layer for adapting the optical behavior and a thin silicon dioxide layer acting as a nitrogen barrier for a resist mask 107 formed on the capping layer 106. The resist mask 107 includes a first opening 107A above the first device region 120A that corresponds to a via opening 105A for electrically connecting the metal line 103A with a metal line still to be formed in the dielectric layer 105.

A typical process flow for forming the semiconductor device 100 as shown in FIG. 1a may comprise the following processes. After the fabrication of any circuit elements within the substrate 101, the dielectric layer 102 may be deposited by well established deposition recipes based on plasma-enhanced chemical vapor deposition (PECVD). For example, the layer 102 may be comprised of silicon dioxide, fluorine-doped silicon dioxide or SiCOH and hence deposition recipes on the basis of appropriate precursors may be employed to form the layer 102. Then the metal line 103A may be formed in accordance with processes as will be described in the following with reference to the layer 105. Thereafter, the etch stop layer 104 is deposited by, for instance, well-established PECVD techniques with a thickness that is sufficient to reliably stop a via and trench etch process to be performed later on. Next, the dielectric layer 105 is formed by CVD or spin coating, depending on the material used. Then, the capping layer 106 is formed by PECVD techniques on the basis of well-established recipes to provide the desired characteristics in the further processing of the device 100. Finally, the resist mask 107 may be formed by advanced photolithography to form the respective opening 107A. Thereafter, an anisotropic etch process is performed, wherein, in an initial phase, the exposed portion of the layer 106 is removed and, in a subsequent process, the dielectric material of the layer 105 is removed to form the via opening 105A.

Figure 1B:
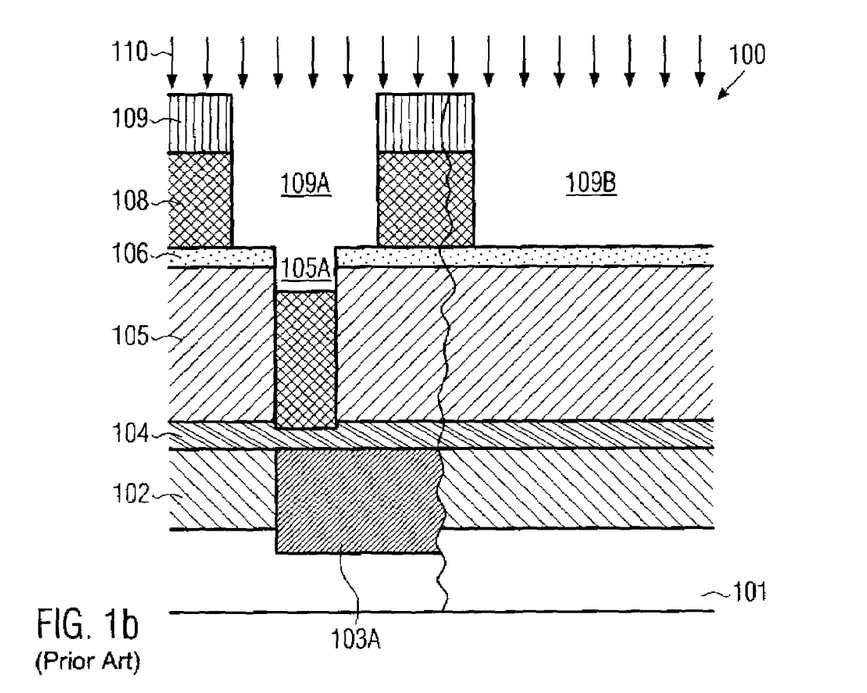

FIG. 1b schematically illustrates the device 100 in an advanced manufacturing stage. The device 100 now comprises a resist mask 109 having formed therein a trench 109A above the via opening 105A with dimensions corresponding to design dimensions of a metal line to be formed above and around the via opening 105A. The resist mask 109 further comprises an opening 109B in the second device region 120B formed in accordance with the design dimensions for a corresponding metal region, such as a test region, wherein the dimensions of the opening 109B may be significantly greater compared to the dimension of the trench 109A, at least in one dimension. For instance, the opening 109B may have a design dimension of 100 μm×100 μm in advanced semiconductor devices of minimal critical dimensions of 50 nm or even less. Moreover, a fill material 108 is formed underneath the resist mask 109, wherein the fill material 108 is also provided within the opening 105A. The fill material may be comprised of a photoresist of different type compared to the resist mask 109, or the fill material 108 may represent any other polymer material that may be applied in a low viscous state to fill the opening 105A while providing a substantially planar surface. The fill material 108 may also serve as an ARC layer during the patterning of the resist mask 109.

The resist mask 109 may be formed by first applying the fill material 108 by, for example, spin coating a resist or a polymer material, then applying a photoresist by spin coating, performing a well-established photolithography process and etching or dry developing the fill material 108 on the basis of the resist mask 109. Thereafter, the device 100 is subjected to an etch ambient 110 on the basis of carbon and fluorine to etch through the layer 106 and remove a portion of the layer 105 to form a trench around the via opening 105A and an opening in the second device region 120B corresponding to the opening 109B, while the fill material 108 in the via opening 105A prevents substantial material removal therein. Moreover, the fill material 108 within the opening 105A, although partially removed during the etch process 110, protects the remaining etch stop layer 104 in the opening 105A so that the metal line 103A is not exposed to the etch ambient 110. After a trench of specified depth is formed around the via opening 105A and a corresponding opening in the second device region 120B, the resist mask 109 and the fill material 108 are removed by, for instance, an oxygen-based plasma treatment.

During the etch process 110, the removal rate for material of the dielectric layer 105 may depend significantly on the geometric structure of the trenches and openings to be formed in the dielectric layer 105. For example, the etch rate at the trench opening 109A, when for instance representing an isolated trench, may be significantly higher compared to the rate at the opening 109B, designed to represent a test region. Generally, in modern semiconductor devices, substantially continuous non-tiled metal plates of increased dimensions compared to metal lines in product areas may be desirable for a variety of test and measurement tasks. Consequently, due to the structure and geometry dependent etch behavior, the etch depth and thus the finally achieved thickness of the large area metal regions may be reduced compared to actual metal lines, thereby potentially resulting in an overall reduced stability of the respective metallization layer.

After the etch process 110, the resist mask 109 and the material of the layer 108 may be removed and the etch stop layer 104 may subsequently be completely opened by a further etch process.

Figure 1C:
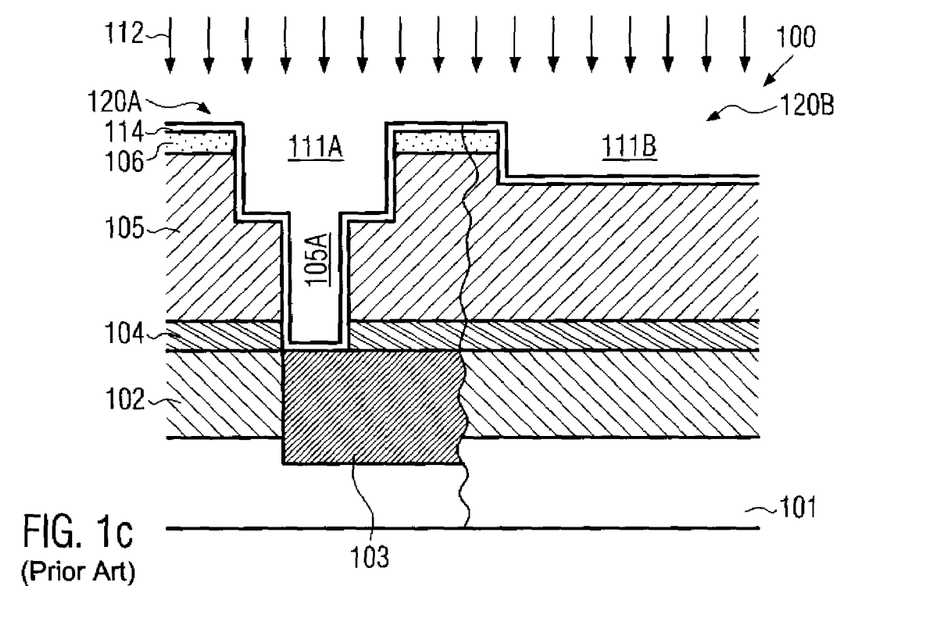

FIG. 1c schematically shows the device after the above process sequence with a trench 111A and an opening 111B formed in the layer 106 and the dielectric layer 105 in the first and second device regions 120A and 120B, respectively. Moreover the device is subjected to a deposition process 112 for forming a conductive barrier layer 114 on exposed surface portions and within the openings 105A, 111A and 111B. The barrier layer 114 may be comprised of any appropriate material, such as tantalum, tantalum nitride, combinations thereof and the like. The barrier layer 114 is selected for reducing the diffusion of copper into the dielectric material of the layer 105 and to suppress diffusion of unwanted material, such as dielectric material, oxygen and the like, into the copper-based material still to be filled in the openings 105A, 111A and 111B. Moreover, the barrier layer 114 has to provide for enhanced adhesion of the copper-based material to the surrounding dielectric material so as to ensure a sufficient mechanical stability of the metallization structure during the further processing and the operation of the device 100. Thus, the material composition and the process conditions used for the deposition process 112 may significantly affect the performance of the resulting metallization layer during the further processing and the operation of the finalized device 100. For example, the barrier layer 114 may be deposited by sputter deposition with predefined parameters with respect to substrate temperature, gas pressure, plasma conditions and the like.

Figure 1D:
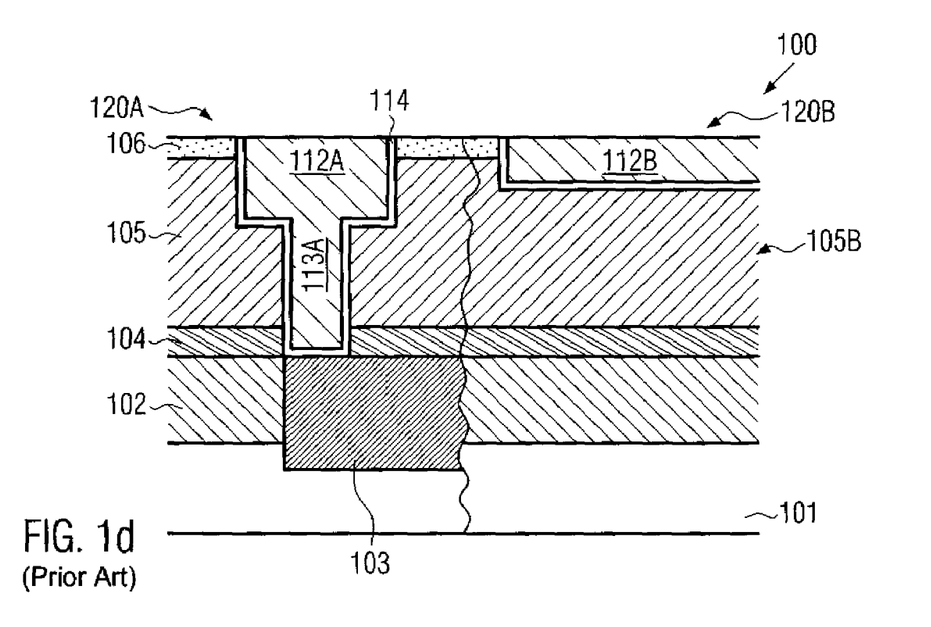

FIG. 1d schematically depicts the device 100 in a further advanced manufacturing stage, in which the device 100 comprises a metal-filled via 113A connecting to the metal region 103 and a metal line 112A formed above the via 113A. In the second die region 120B, a metal area 112B is formed, whose thickness may be reduced compared to the thickness of the metal line 112A due to potential etch non-uniformities during the etch process 110, as previously explained.

A typical process flow for forming the device 100 as shown in FIG. 1d may include the deposition of a seed layer (not shown) followed by an electrochemical deposition of copper or a copper alloy, wherein a certain amount of excess material is usually provided in order to reliably fill the openings 105A, 111A and 111B. Thereafter, the excess material may be removed for instance by chemical mechanical polishing (CMP). Since CMP is one of a plurality of process steps in which additional mechanical forces, for example in the form of shear forces, act on the device 100, a delamination of material may be observed, wherein in particular an area at or below the metal area 112B, indicated as 105B, may suffer from increased material delamination. Since material delamination may represent the initial phase of the formation of cracks within the dielectric layer 105, which may even propagate into the device region 120A, a significant yield loss or reduced reliability during the further processing and the operation of the device 100 may result. In view of this situation, in some approaches, the design of the device is correspondingly altered to maintain the size of the metal area 112B below a certain critical value and/or provide a structure of dummy vias below the metal area 112B. In this way, undue delamination of or within metallization layers may be significantly reduced. However, the functionality of the modified metal region 112B with respect to certain test procedures and the indication of severe flaws in the characteristics may be reduced or may no longer be available, since the size and structure may have to be altered and delamination events, possibly hinting at flaws in the process flow, may no longer occur.

In view of the situation described above, there exists a need for an improved technique which solves or at least reduces the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables a non-destructive estimation of process and/or material characteristics during a process flow for forming metallization layers of semiconductor devices. For this purpose, metal plates having an appropriate size are formed in accordance with a specified process flow in a metallization layer, wherein a size of the metal plate is selected appropriately so as to exhibit an increased probability for delamination events during the manufacturing sequence compared to metal regions in an actual device area, while additionally the probability for a full delamination of the metal plate is significantly reduced by appropriately designing the periphery of the metal plate, thereby also reducing the risk of the formation of cracks, which may adversely affect the further processing of the semiconductor device. Consequently, based on the degree of delamination detected in the metal plate, characteristics of the process flow and thus of the status of the metallization layer may be effectively estimated, substantially without affecting the further processing and the performance of the finalized device.

According to one illustrative embodiment of the present invention, a method comprises forming a metal-comprising test plate in a metallization layer stack of a semiconductor device formed above a substrate, wherein the metal-comprising test plate comprises a delamination test region and an adhesion region having an enhanced adhesion within the metallization layer stack compared to the delamination test region. Furthermore, the method comprises estimating a degree of delamination in the delamination test region.

According to another illustrative embodiment of the present invention, a method comprises forming a metal plate above a first region in a metallization layer stack for a semiconductor device to be formed according to a specified manufacturing sequence, wherein the metal plate has a size enabling a non-destructive inspection of a central region of the metal plate. Moreover, the method comprises forming an adhesion region in the metallization layer stack to be in contact with the metal plate, wherein the adhesion region is located adjacent to and in contact with the central region and has a reduced probability for delamination during the specified manufacturing sequence compared to the central region.

According to yet another illustrative embodiment of the present invention, a semiconductor structure comprises one or more semiconductor circuit elements formed above a first substrate region. Furthermore, a metal plate is formed above a second substrate region in a metallization layer stack formed above the first and second substrate regions, wherein the metal plate has a periphery and a central region that is dimensioned for a non-destructive inspection. Moreover, the semiconductor structure comprises an adhesion region bordering the central region of the metal plate, wherein the adhesion region is configured to impart to the periphery of the metal plate an increased mechanical stability compared to the central region.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is generally directed to a technique for forming metallization layers in accordance with a damascene or inlaid strategy, wherein, in addition to metal lines and vias, large area metal regions are also provided for monitoring the status of the metallization layer and/or for estimating specific process characteristics of the manufacturing process for the metallization layer. In this respect, a metallization layer is to be understood as a dielectric layer formed above a device layer, i.e., one or more layers having formed therein semiconductor circuit elements, such as transistors, capacitors, resistors and the like, wherein metal lines and metal regions are provided in the dielectric material of the metallization layer which provide the inner layer electrical connection of circuit elements, whereas vias may be connected at certain locations to the respective metal lines. Consequently, the vias establish an electrical connection to a lower-lying metal region, thereby finally providing an electrical connection to one or more of the semiconductor circuit elements within the device layer. As previously explained, in sophisticated semiconductor devices, highly conductive metals, such as copper and copper alloys, are typically used and are applied on the basis of the damascene technique, in which the dielectric material is provided with respective openings that are subsequently filled with the copper or copper alloy, thereby requiring advanced anisotropic etch techniques in combination with advanced CMP processes and barrier layer deposition techniques. Moreover, copper and alloys thereof are frequently used in combination with low-k dielectric materials, i.e., materials having a dielectric constant of 3.0 or even less, which may exhibit a reduced mechanical stability and also reduced adhesion to the copper-based metal. Consequently, an increased probability for delamination within the metallization layers may be observed, in particular when metal regions of increased lateral dimensions are to be formed in a specified metallization layer. The increased delamination at areas including large metal plates used for test purposes may, however, lead to the formation of cracks in the metallization layer, which may also extend into device areas, thereby reducing yield and reliability. Although increased delamination of corresponding metal plates may be significantly reduced by corresponding design measures, such as reducing the size of a corresponding metal plate below a certain critical value, nevertheless certain drawbacks are associated with these design measures, such as reduced design flexibility and loss of valuable information on characteristics and the status of metallization layers and the associated manufacturing process flow.

According to one illustrative aspect of the present invention, large area metal plates may still be maintained in the semiconductor device, while nevertheless reducing the risk for a complete delamination of such metal plates by providing an area of increased adhesion, also referred to as an adhesion region, which is connected with the metal of the metal plate and exhibits a significantly enhanced adhesion to the surrounding material, such as the surrounding dielectric material, and/or any under- or overlying material layers with respect to the metal plate, thereby significantly reducing the risk of the formation of any cracks. However, due to the provision of the large area metal plate, in which a highly "localized" delamination may occur, an effective monitoring area is provided, in which the occurrence of any delamination events may be appropriately associated with any characteristics of the metallization layer as well as the corresponding manufacturing process.

Figure 2A:
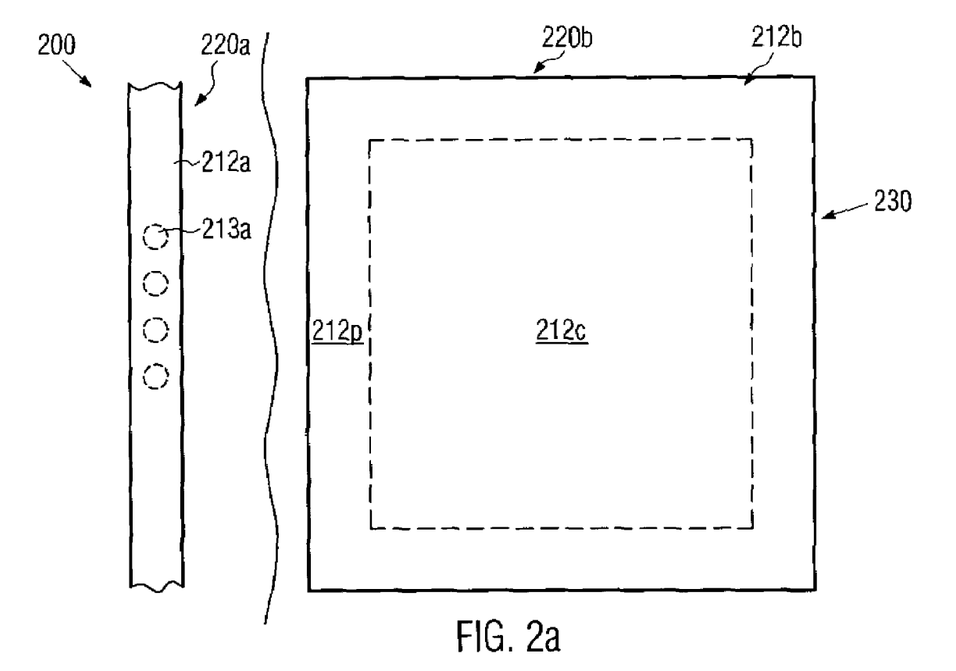
FIGS. 2a-2b schematically show a top view of a semiconductor device in the form of a design layout, which may be used for determining an area of a metal plate for non-destructive inspection in view of delamination events, which is bordered by an area of increased adhesion.

With reference to FIGS. 2a-2h, further illustrative embodiments of the present invention may now be described in more detail. FIG. 2a schematically illustrates a view of a semiconductor device 200, wherein FIG. 2a may be understood as representing a wiring layout of an integrated circuit that may form a part of the semiconductor device 200 shown. In other cases, the semiconductor device 200 may be understood as representing a certain type of semiconductor device including all of the functional and non-functional components required for the fabrication of a specific type of semiconductor device. For instance, the semiconductor device 200 may represent the layout or a real version of a semiconductor device similar to the device as shown in FIGS. 1a-1d, in which, in addition to actual circuit elements and the corresponding wiring, a corresponding metal plate for test purposes is to be provided. Hence, the semiconductor device 200 or the layout thereof may comprise one or more metallization layers, one of which is indicated in the top view of FIG. 2a as a layer 230. The device 200 may comprise a first device region 220a and a second device region 220b, which may not necessarily be located in the same die region when the second device region 220b is to represent a specified test region that has to be provided at few specified substrate locations only. In other illustrative embodiments, the first and second device regions 220a and 220b may be located within the same die region, i.e., within a portion formed above an appropriate substrate, which may act as a functional unit after dicing the substrate and separating the individual die regions. The first device region 220a may include a plurality of metal lines, of which only one representative metal line 212a is illustrated. The metal line 212a may be connected to a lower-lying metal region or contact region by one or more vias 213a.

In the second device region 220b, a metal region 212b is provided which may exhibit significantly increased dimension, at least in one lateral direction. The metal region 212b may include a central area 212c and a periphery 212p, wherein, in one embodiment, the central region 212c and the periphery 212p represent a metal area that is at least in some areas continuous so that a direct mechanical connection exists between the metal of the central region 212c and the periphery 212p. The central region 212c and the periphery 212p are configured to have a significantly different adhesion and thus resistance against delamination with respect to a preceding and a subsequent manufacturing sequence. As previously explained, by providing a substantially structureless metal plate, as is for instance shown in FIGS. 1c and 1d, the resulting metal region may have a moderately low adhesion to the surrounding materials, thereby exhibiting a high probability for delamination events during the manufacturing process for forming the metal region and during subsequent manufacturing steps. Thus, the central region 212c may represent a corresponding metal region, wherein the size thereof is selected such that a certain probability for the occurrence of delamination events with respect to a specified manufacturing sequence and material composition of the corresponding metallization layer is obtained. For example, as previously explained with reference to FIGS. 1a-1d, in many cases substantially non-tiled metal plates of increased area may be advantageous with respect to certain test procedures, such as the monitoring of CMP dishing effects and the like. Consequently, the lateral size of the central region 212c is selected in accordance with design requirements with respect to the test function of the metal region 212b, wherein, however, in this area substantially no additional design measures are taken to reduce the probability for delamination events. Rather, the lateral size of the central region 212c, which may be in the range of approximately 2500 µm square or higher for semiconductor devices, including circuit elements of critical dimensions of 100 nm and significantly less, is selected such that a non-destructive inspection of the central region 212c, for instance with respect to surface irregularities, may enable a quantitative estimation of characteristics of the process flow and/or the status of the metallization layer 230, as will be described later on in more detail.

On the other hand, the periphery 212p has a moderately high adhesion, which may be obtained by appropriately structuring the region 212p so as to impart an increased adhesion to the periphery 212p, thereby significantly suppressing the probability for a complete delamination of the metal region 212b, since the periphery may act as a delamination "barrier." By bordering the central region 212c, which may therefore act as a monitoring area for a non-destructive characterization of process flow and material characteristics, the risk for negatively affecting circuit elements, such as the metal line 213a in the first device region 220a, may be significantly reduced. Hence, valuable information on the process flow and the characteristics of the metallization layer 230, and possibly of other metallization layers formed below the layer 230, may be obtained by inspecting the central region 212c, which may undergo delamination events that are locally restricted to the central region 212c by the periphery 212p.

Figure 2B:
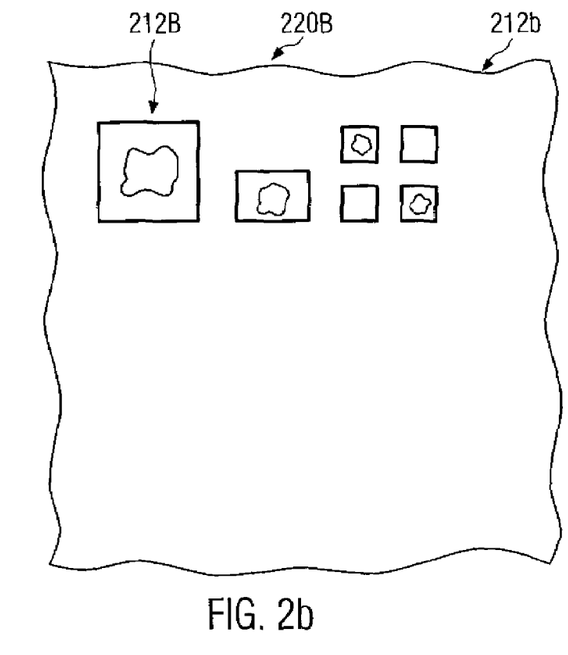

FIG. 2b schematically shows a top view of the semiconductor device 200 in the form of an actual semiconductor structure, wherein, in the second device region 220B, may be formed a plurality of metal regions 212B, wherein at least some of these regions 212B have a different lateral size. In one illustrative embodiment, the semiconductor structure 200 as shown in FIG. 2b may represent a test device having formed therein the plurality of metal regions 212B with different sizes so as to estimate an appropriate lateral dimension of the central region 212c (see FIG. 2a) for a specified process flow and type of semiconductor device to be formed. That is, in this embodiment, a specified manufacturing sequence may be performed in order to form the metal regions 212B, wherein the occurrence and/or the degree of delamination may be estimated on the basis of a subsequent inspection of the plurality of metal regions 212B. For example, a lateral size of 100 µm×100 µm may be used as a standard size that may be appropriate for performing an efficient inspection, such as an optical inspection by microscope on the basis of manual evaluation or automated image recognition systems, or any other appropriate inspection techniques, such as the detection of surface reflectivity and the like, wherein also metal regions 212B having a larger size and a smaller size may be provided in order to identify an appropriate size for the central region 212c.

After processing the device 200 as shown in FIG. 2b in accordance with a specified manufacturing sequence, which in some illustrative embodiments may include substantially the same process steps as may also be used for actual products, the degree and/or number of delamination events may be determined for various sizes of the metal regions 212B. For example, a size corresponding to the left metal region 212B may result in a high degree of delamination wherein, for instance, a high probability may exist that substantially each metal region 212B having the respective size may experience a corresponding delamination event. On the other hand, smaller metal regions 212B, such as shown on the right-hand side, may have a moderate probability for the occurrence of delamination events, which may render, in some illustrative embodiments, the corresponding size, an appropriate size, since a variation of material characteristics and/or process characteristics, resulting in increased or decreased adhesion characteristics of the metal regions 212B, may be efficiently monitored on the basis of an increase or decrease of the corresponding number or degree of delamination events. In still other illustrative embodiments, any other appropriate size may be selected, such as a size that may result in substantially no delamination events for a process flow meeting the test specifications. In still other illustrative embodiments of the present invention, a plurality of different appropriate lateral sizes of the central regions 212c may be determined and may be used during the processing of actual product substrates as efficient non-destructive test areas for characterizing the manufacturing process and/or the status of the respective metallization layer.

In one illustrative embodiment, the semiconductor structure 200 as shown in FIG. 2b may also be used for determining a correlation between specific material characteristics and/or process characteristics of the process flow under consideration with the degree and/or amount of delamination events. For example, one or more process parameters involved in the formation of the metallization layer 230 of actual product substrates may be varied for a plurality of test structures 200 as shown in FIG. 2b, in order to determine the degree and amount of delamination events for a respective parameter setting. For instance, CMP parameters may be varied and the resulting degree and/or number of delamination events for one or more different sizes of the metal regions 212B may be recorded and evaluated. Similarly, process parameters for forming a barrier and adhesion layer, as is typically provided for copper-based metallization layers, may be appropriately varied in order to identify a corresponding relationship between any delamination events and one or more process parameters or material characteristics of the barrier and adhesion layer.

In still other illustrative embodiments, other experimental data may be correlated to the degree and number of delamination events, such as electrical data and the like. For this purpose, the semiconductor structure 200 as shown in FIG. 2b may also include a plurality of actual circuit elements, one or more characteristics of which may be used to establish a correlation between the device status and process flow characteristics and the delamination. For example, electromigration test results may be obtained and may be correlated with the inspection results for a given set of material parameters and process flow parameters. In some illustrative embodiments, the metal regions 212B of the semiconductor structure 200 having the different sizes for estimating an appropriate size for the central region 212c and/or for estimating a correlation with material characteristics and/or process flow parameters may be provided in combination with respective adhesion regions, such as the periphery 212p (FIG. 2a) so as to simultaneously estimate the efficiency of the respective periphery in terms of its capability for suppressing any complete delamination and/or for suppressing any formation of cracks in neighboring device areas. Consequently, an appropriate combination of central region 212c and periphery 212p may be selected on the basis of the inspection results from the semiconductor structure 200 as shown in FIG. 2b.

Figure 2C:
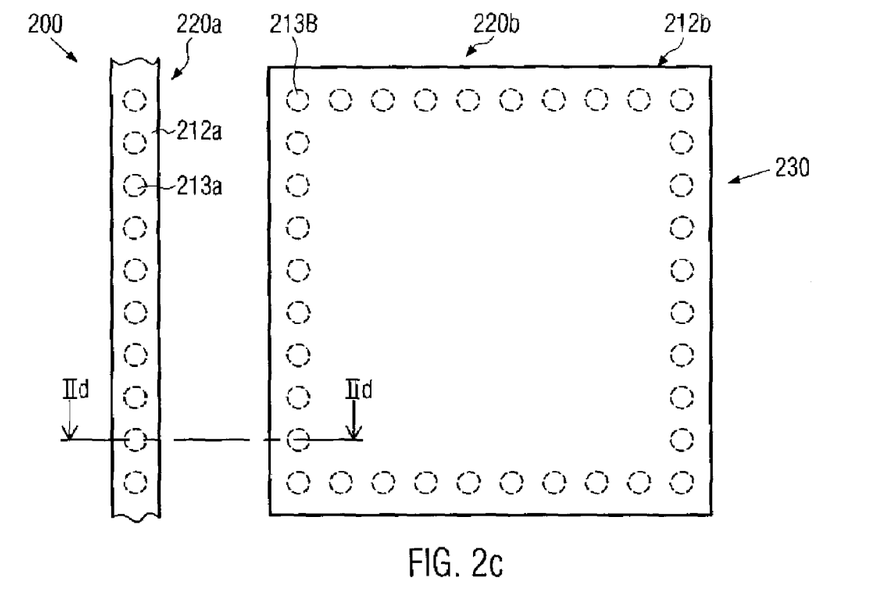
FIGS. 2c-2d schematically illustrate a top view and a cross-sectional view, respectively, in which a region of increased adhesion is realized by additional dummy vias in accordance with the present invention.

FIG. 2c schematically shows a top view of the semiconductor device 200 or a layout thereof, wherein the periphery 212p of the metal region 212b is provided in the form of a plurality of dummy vias 213B formed below the metal of the periphery 212p of the metal region 212b, thereby providing an increased adhesion due to the "anchoring" effect of the dummy vias 213B. In this respect, a dummy via may be understood as a metal-filled plug extending at least partially through the dielectric material towards a lower-lying material layer, wherein the dummy via, in contrast to functional vias provided in product areas of a semiconductor device, may not necessarily be electrically connected to any semiconductor circuit elements required for a specified circuit layout of an integrated circuit to be operational. Consequently, the dummy vias 213B connected to the metal region 212b provide a significantly increased adhesion area to the neighboring dielectric material and hence significantly reduce the probability for delamination compared to the central region 212b, which lacks the dummy vias 213B and thus may readily experience a delamination event.

Figure 2D:
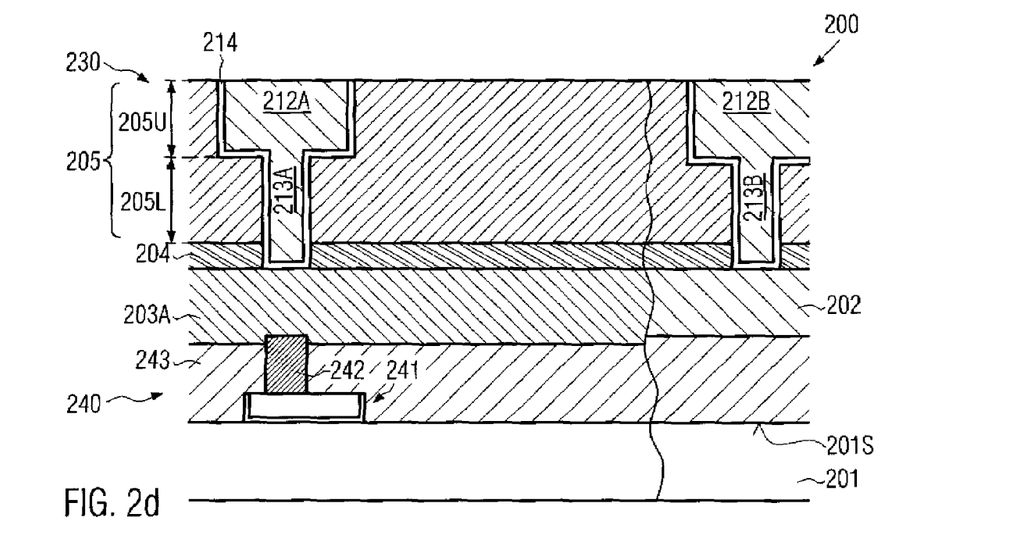

FIG. 2d schematically shows a cross-sectional view of the layout or device as shown in FIG. 2c taken along the line indicated in FIG. 2c as IId. Hence, the device 200 or its layout may comprise a substrate 201 in and on which is provided a device layer 240, which may include a plurality of circuit elements, such as semiconductor circuit elements in the form of transistors, resistors, capacitors and the like. The corresponding circuit elements are collectively indicated as 241, which may represent in the illustrative embodiment a field effect transistor, wherein the cross-section is taken along the transistor width direction, that is, the horizontal direction in FIG. 2d may represent the width direction of the transistor 241. Moreover, the device layer 240 may include metal-containing contact plugs 242 that are formed within an interlayer dielectric material 243 and which may be connected to respective contact regions of the circuit element 241. A first metallization layer, which may be represented by a dielectric layer 202 and a plurality of metal lines included therein, which are represented by the metal line 203A extending along, for instance, the transistor width direction, is provided above the device layer 240. Above the first metallization layer, represented by the dielectric layer 202 and the metal line 203A, may be formed a further metallization layer, such as the metallization layer 230 as illustrated in FIG. 2c. In the first device region 220A, the respective metal line 212A may extend substantially perpendicularly, due to a typical design of metallization layers, to the metal line 203A and may be formed in an upper portion 205U of a dielectric layer 205. Furthermore, the vias 213A may extend through a lower portion 205L of the dielectric layer 205 in order to connect the metal line 212A with the line 203A. It should be noted that in some embodiments of advanced semiconductor devices the dielectric layer 205 may be provided so as to be comprised of a low-k dielectric material, at least in the upper portion 205U. Similarly, in the second device region 220B, the metal region 212B is provided in the upper portion 205U, wherein the height of the metal region 212B may differ from the corresponding height of the metal line 212A due to any etch non-uniformities, when the thickness of the upper portion 205U is defined by an etch process rather than by the location of an etch stop layer in a manufacturing process for forming the vias 213A and the metal lines and metal regions in the upper portion 205U. In this respect it should be appreciated that any position information and statements, such as "upper," "lower," "above," "below," "vertical," "horizontal," "lateral" and the like, may be understood with respect to the substrate 201. For example, a lateral direction is to be considered as a direction substantially extending parallel to a surface of the substrate 201. A component or layer is located below another layer when the distance of the former component or layer with respect to the surface of the substrate 201 is less compared to the latter layer.

A typical process flow for forming the semiconductor device 200 may comprise substantially the same processes as previously described with reference to the semiconductor device 100. Hence, after the formation of the circuit elements 241 within the device layer 240 including the contact plugs 242 on the basis of well-established recipes, the first metallization layer, represented by the dielectric layer 202 and the one or more metal lines 203A, may be formed on the basis of well-established techniques, wherein, as previously explained, a low-k dielectric material is frequently used in combination with copper or copper alloys. Thereafter, the second metallization layer 230 may be formed by providing an appropriate dielectric material, such as a low-k dielectric material, wherein, in one illustrative embodiment, corresponding via openings may be formed in the upper and lower portions 205U, 205L of the dielectric layer 205 on the basis of the layout as shown in FIG. 2c, thereby providing the periphery 212p as an adhesion region having the enhanced adhesion. Consequently, a plurality of respective via openings are formed below an area corresponding to the periphery 212p. Thereafter, corresponding openings for the metal line 212A and the metal region 212B, which has lateral dimensions that may have been determined according to the procedure described above with reference to FIG. 2c, may be formed by well-established techniques above the corresponding via openings including the openings for the functional vias 213A and the dummy vias 213B.

Thereafter, the barrier and adhesion layer 214, possibly followed by a seed layer (not shown), may be formed in the via openings, wherein, as previously explained, the deposition parameters as well as the material composition of the barrier layer 214 may have a significant influence on the overall performance of the metal line 212A. For example, the barrier layer 214, for instance comprised of tantalum, tantalum nitride and the like, may be deposited by sputter deposition, chemical vapor deposition (CVD), atomic layer deposition (ALD), etc., wherein, for a given material composition, process parameters, such as deposition temperature and the like, may significantly influence the finally obtained characteristics of the layer 214. Consequently, any material and process variations encountered during the formation of the barrier and adhesion layer 214 may affect the adhesion characteristics of the metal region 212B so that, after completion of the region 212B, an efficient process monitor may be provided for monitoring and controlling the characteristics of the layer 214. After the formation of the barrier layer 214 and possibly of a seed layer, the metal line 212A and the region 212B may be formed by filling in an appropriate metal, such as copper, copper alloy and the like. Typically, the characteristics of the metal in the line 212A and the region 212B may depend on process specifics, such as the crystallinity of the seed layer, if provided, and the like, as well as post-deposition treatments, such as anneal procedures and the like, which may therefore also have an influence on the finally obtained characteristics of the metal line 212A and the metal region 212B. Thereafter, any excess material of the metal filled in the metal line 212A and the region 212B, as well as the seed layer and the barrier layer 214, may be removed, which is typically accomplished by a process sequence comprising a CMP process. During the CMP process, significant shear forces may be exerted to the device 200, thereby possibly promoting the delamination, in particular within the large area metal region 212B, which may then be efficiently detected by optical or other inspection techniques.

After the manufacturing sequence for forming the metallization layer 230, the region 212B, i.e., the central region 212c thereof, may be inspected so as to detect any surface irregularities, which may indicate the presence of a delamination event. For example, the number and/or the degree, i.e., the size, of a surface irregularity, which indicates a delamination event, may be recorded and may be evaluated with respect to at least one characteristic of the layer 230 or the manufacturing sequence for forming the layer 230, as described above. For example, an increased rate of surface irregularities, indicating an increased tendency for material delamination in the region 212B may indicate a reduced mechanical stability of the metallization layer 230, thereby rendering the corresponding semiconductor device 200 less reliable compared to other devices having a reduced rate of surface irregularities. In still other embodiments, any correlation established between the materials and/or the process flow for forming the metallization layer 230, previously established, as is for instance described with reference to FIG. 2b, may be used to identify a material and/or process deviation during the formation of the layer 230. For this purpose, the process history of a respective substrate 201 may be analyzed in order to identify a possible source of a reduced adhesion. For example, if it may be ascertained that specific substrates or lots of substrates, produced by a specific sputter deposition chamber, may result in an increased rate of surface irregularities in the region 212B, the corresponding chamber may be identified and re-adjusted or may be temporarily excluded from the process flow for maintenance. As previously explained, due to the provision of the periphery 212p, which in the present embodiment is realized by providing the dummy vias 213B, a full delamination of the metal region 212B is substantially avoided, thereby substantially not negatively influencing the further processing of the device 200, irrespective of the degree and number of delamination events detected in the region 212B. Hence, the inspection of the metal regions 212B may provide in-line measurement data that may be used as feedback and/or feed forward information for a process tool of the preceding or the subsequent process flow. For instance, based on a previously established correlation to one or more process parameters, the inspection data may be used as measurement data for an APC (advanced process control) system for the process sequence for forming the metallization layer 230 or for a process sequence for forming additional metallization layers. Moreover, the inspection data may additionally or alternatively be used as input for a fault detection and classification system so as to determine failures in process tools associated with the manufacturing sequence for forming the device 200.

Figure 2E:
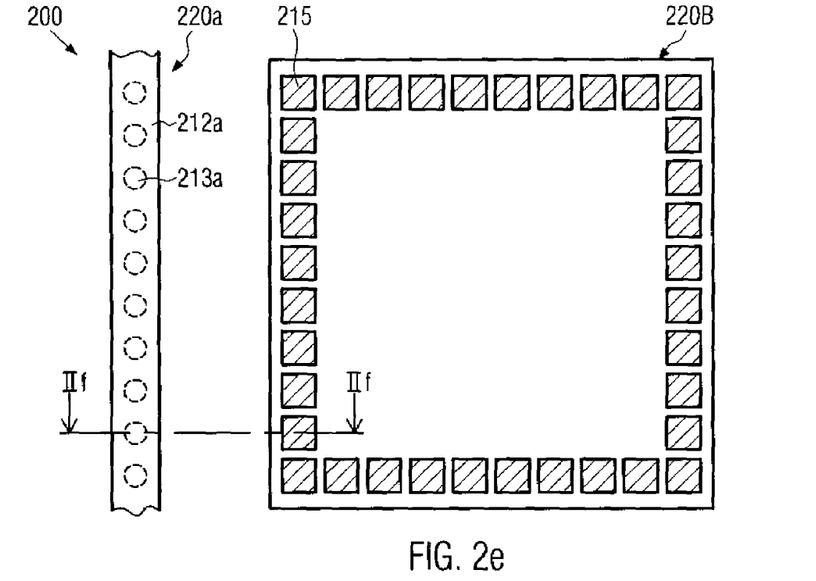
FIGS. 2e-2f illustrate a top view and a cross-sectional view, respectively, in which the adhesion region of a test metal plate is provided in the form of dielectric islands in accordance with still other illustrative embodiments of the present invention.

FIG. 2e schematically illustrates the top view of the semiconductor device 200, in which the periphery 212p of the metal region 212b is provided in the form of dielectric islands 215 extending through the metal of the metal region 212b. By providing the islands 215 within the continuous metal area of the region 212b, an increased adhesion may be obtained within the periphery 212p, thereby significantly reducing the risk for metal delamination. Hence, the central region 212c is effectively delineated and may thus act as an efficient delamination monitor, as is previously described.

Figure 2F:
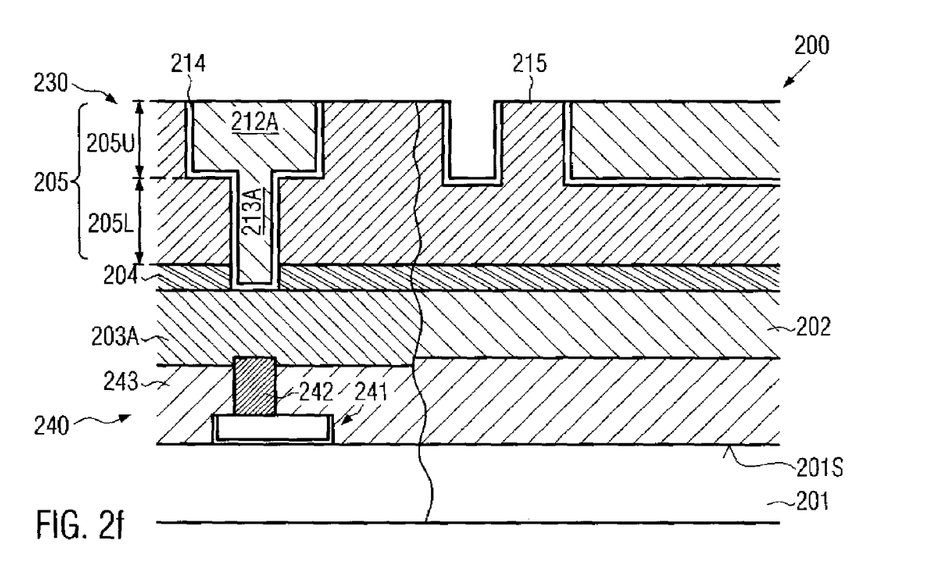

FIG. 2f schematically illustrates a cross-sectional view of the device 200 as shown in FIG. 2e. Hence, the device 200 comprises the dielectric islands 215 formed in the upper portion 205U of the dielectric layer 205, thereby forming an effective barrier for delamination that may occur in and below the central region 212c. Regarding a manufacturing sequence for forming the dielectric islands 215, substantially the same processes may be performed as are previously described, wherein, during the formation of corresponding trench openings for the metal lines 212A, a modified lithography mask may be used in order to cover the area of the islands 215 during the subsequent anisotropic etch process. It should be appreciated that, in other illustrative embodiments, any appropriate shape and dimension for the dielectric islands 215 may be used, such as rectangular shapes, circular shapes and the like, while, in other illustrative embodiments, the dielectric islands 215 may be combined with any appropriate pattern of vias, such as the vias 213B, wherein any spatial arrangement of the islands 215 and the respective vias may be selected in accordance with process requirements. For instance, as previously explained with reference to FIG. 2b, appropriate patterns and configurations of the periphery 212p may be tested with respect to their delamination behavior on the basis of an analysis of corresponding test substrates and/or product substrates having formed thereon different types of peripheral regions 212p in combination with the same central region 212c. Similarly, it should be appreciated that the configuration of the vias 213B, shown in FIG. 2c, is of illustrative nature only, and any other arrangement of vias at the periphery 212p may be selected, such as two or more via chains and the like.

Figure 2G:
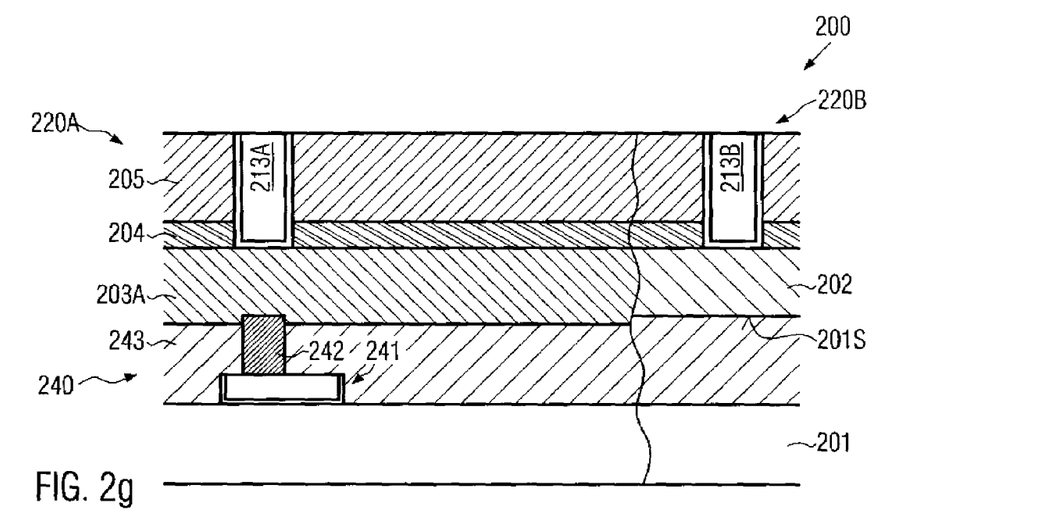
FIG. 2g schematically illustrates a cross-sectional view of a semiconductor device having formed therein a plurality of dummy vias, which define an adhesion region of a test metal plate still to be formed in accordance with yet other illustrative embodiments.

FIG. 2g schematically shows the semiconductor device 200 according to another illustrative embodiment, wherein the vias 213A and the dummy vias 213B are completely formed prior to the formation of the corresponding metal lines and metal regions. For this purpose, the lower portion 205L may be formed and may be subsequently patterned so as to receive corresponding via openings in accordance with the design of the device 200 as shown, for instance, in FIG. 2c. Thereafter, the respective openings may be provided with an appropriate barrier and seed material, such as the barrier layer 214, and thereafter metal such as copper, may be deposited on the basis of well-established techniques. Next, any excess material may be removed, for instance by CMP and/or electrochemical etch techniques. Thereafter, the upper portion 205U may be formed, possibly by providing an intermediate etch stop layer (not shown), and may then be patterned to provide the corresponding openings for the metal line 212A and the metal region 212B. Again, a barrier material, possibly in combination with a seed material, may be deposited and subsequently the openings may be filled with metal, with a subsequent removal of any excess material. Since the vias 213A and 213B are efficiently connected to the metal filled into the overlying metal lines and regions, also in this manufacturing sequence an effective increase of adhesion is obtained for the periphery 212p.

Figure 2H:
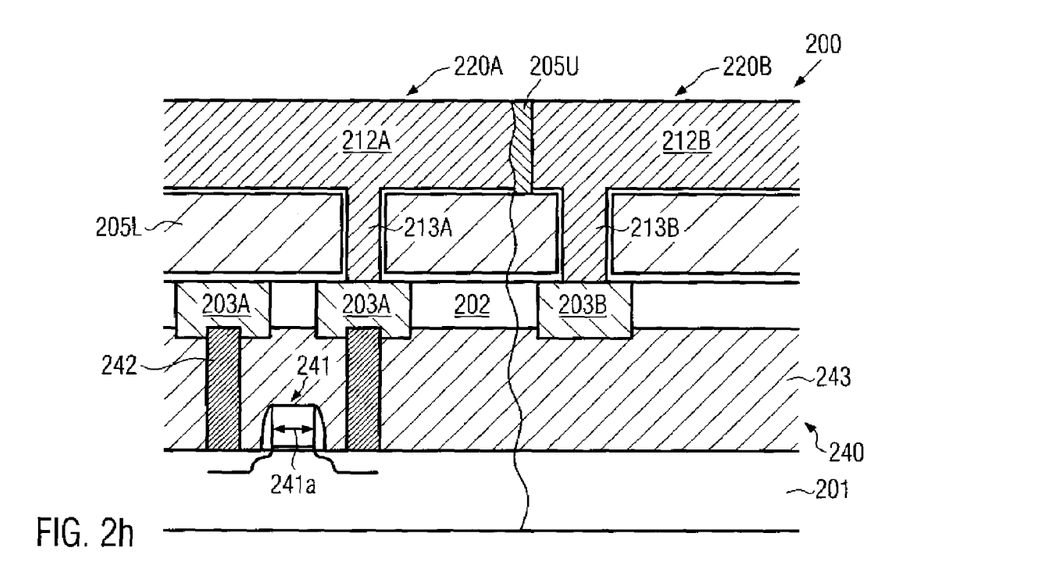
FIG. 2h schematically illustrates a test metal plate having formed therein dummy vias connected to corresponding dummy metal lines in a lower-lying metallization layer according to still other illustrative embodiments of the present invention.

FIG. 2h schematically shows a cross-sectional view of the semiconductor device 200 in accordance with yet another illustrative embodiment of the present invention. In this embodiment, an additional increase of adhesion of the periphery may be achieved by "anchoring" the dummy vias 213B in respective metal lines 203B that are formed along with the respective metal line 203A in the device region 220A. It should be appreciated that the device 200 is shown in a cross-sectional view corresponding to a length direction of the device 241, wherein for instance, a gate length 241a of the transistor 241 may be, for instance, 100 nm or even less. While corresponding contact plugs 242 are connected to the respective metal lines 203A, the metal lines 203B may be provided in any appropriate dimension and form so as to connect to at least some of the dummy vias 213B, thereby significantly increasing the total adhesion of the periphery 212p. In one illustrative embodiment, the metal lines 203B may be formed below the metal region 212B so as to substantially resemble the periphery 212p thereby connecting to each of the dummy vias 213B. Consequently, an even enhanced difference in adhesion between the periphery 212p and the central region 212c may be achieved, thereby even more reliably suppressing a full delamination of the region 212B. Consequently, the central region 212c may be selected with an increased size, if desired, so as to increase the "sensitivity" of the metal region 212B for process and material induced delamination events. For example, an area of approximately 2,500-10,000 µm² or more may be provided for sophisticated applications with metallization schemes featuring critical dimensions in the device layer 240, such as the gate length 241a, of approximately 50 nm and less.

It should be appreciated that the dummy vias 213B in combination with the underlying metal lines 203B may also be combined with any other adhesion increasing designs, such as the dielectric islands 215 as shown in FIGS. 2d and 2e.

As a result, the present invention provides a new technique for the formation of metallization layers including a monitoring area for non-destructive monitoring of process flow and material characteristics. For this purpose, a large area metal plate is provided which is bordered, at least on some boundaries, by an adhesion region having an increased adhesion with respect to a central region of the metal plate, thereby allowing the central region of the metal plate to delaminate, while a full delamination of the metal plate is substantially avoided. Consequently, valuable information on process flow and material characteristics may be obtained on the basis of the evaluation of the degree and/or number of surface irregularities, indicating a delamination event, while substantially not negatively affecting the further processing of the semiconductor device, since the formation of cracks within the metallization layer is significantly suppressed by the adhesion region. In illustrative embodiments, an increased adhesion of the periphery of the metal plate may be achieved by the provision of structural features, such as dummy vias, dielectric islands and the like, which may be readily included in the conventional process flow, thereby providing a high degree of process compatibility. Moreover, based on the evaluation of delamination events that may be detected by optical inspection on a manual or automated basis, process flow insufficiencies, for instance in the form of defective process tools and the like, may be efficiently identified. Furthermore, process parameters, which may be critical for the mechanical characteristics of the metallization layer, may be identified and may be efficiently monitored and, in some embodiments, be controlled by measurement data obtained from the test structure of the present invention. For this purpose, appropriate correlations may be established between one or more process parameters and the respective delamination behavior of the corresponding monitoring areas, which may be accomplished on the basis of dedicated test substrates or even on the basis of product substrates, as a negative influence on the further processing of substrates may be substantially prevented by the provision of an adhesion region which may act as a barrier for the delamination occurring in the central region of the metal plate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a metal-comprising test plate in a metallization layer stack of a semiconductor device formed above a substrate, said metal-comprising test plate comprising a delamination test region and an adhesion region having an enhanced adhesion within said metallization layer stack compared to said delamination test region; and
   estimating a degree of delamination in said delamination test region.

2. The method of claim 1, wherein estimating a degree of delamination in said delamination test region comprises optically inspecting said delamination test region.

3. The method of claim 1, further comprising monitoring a process sequence applied for forming said metallization layer stack on the basis of said estimated degree of delamination of said metallization layer stack.

4. The method of claim 3, further comprising identifying at least one process of said process sequence as a source of increased delamination on the basis of a result of said monitoring.

5. The method of claim 1, wherein forming said metal-comprising test plate comprises determining a critical size for a metal area so as to suffer from increased delamination for a specified manufacturing sequence, selecting a size of said delamination test region to be greater than said critical size and forming said adhesion region so as to delineate said delamination test region.

6. The method of claim 5, wherein forming said adhesion region delineating said delamination test region comprises forming a plurality of dummy vias in a dielectric layer enclosing said metal-comprising test plate, said dummy vias connecting to said metal-comprising test plate.

7. The method of claim 6, wherein said dummy vias are formed to connect to one or more metal regions located below said metal-comprising test plate.

8. The method of claim 5, wherein said adhesion region comprises one or more islands of non-metal material.

9. The method of claim 1, further comprising using said estimated degree of delamination in controlling at least one process parameter of a process for forming said metallization layer stack on the basis of said estimated degree of delamination.

10. A method, comprising:
forming a metal plate above a first substrate region in a metallization layer stack for a semiconductor device to be formed according to a specified manufacturing sequence, said metal plate having a size enabling a non-destructive inspection of a central region of said metal plate; and
forming an adhesion region in said metallization layer stack to be in contact with said metal plate, said adhesion region being located adjacent to said central region and having a reduced probability for delamination during said specified manufacturing sequence compared to said central region.

11. The method of claim 10, wherein forming said metal plate comprises forming at least one of a metal line and a via in said metallization layer stack above a second substrate region.

12. The method of claim 10, wherein forming said adhesion region comprises forming a plurality of dummy vias connecting to said metal plate outside of said central region.

13. The method of claim 12, wherein said metal plate and said dummy vias are formed by filling in a metal in a common deposition process.

14. The method of claim 12, wherein said dummy vias are formed prior to forming said metal plate.

15. The method of claim 10, wherein forming said adhesion region comprises forming a plurality of non-metal islands in said metal plate.

16. The method of claim 12, wherein said dummy vias are formed to connect to one or more metal regions located below said metal plate.

17. The method of claim 10, further comprising inspecting said central region in one or more of a plurality of substrates comprising said metallization layer stack formed according to said specified manufacturing sequence with respect to a delamination event.

18. The method of claim 17, further comprising estimating at least one characteristic of said specified manufacturing sequence on the basis of said inspecting said central region.

19. The method of claim 18, wherein estimating said at least one characteristic comprises identifying at least one of a material and a process parameter used in at least one of the processes of said specified manufacturing sequence as a source of increased delamination and controlling said at least one process on the basis of a result of inspecting said central region in substrates processed by said at least one process.

* * * * *